United States Patent
Lee

(10) Patent No.: US 9,219,244 B2
(45) Date of Patent: Dec. 22, 2015

(54) ORGANIC LIGHT-EMITTING DISPLAY APPARATUS AND METHOD OF MANUFACTURING ORGANIC LIGHT-EMITTING DISPLAY APPARATUS

(71) Applicant: Samsung Display Co., Ltd., Yongin, Gyeonggi-Do (KR)

(72) Inventor: Won-Kyu Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/679,321

(22) Filed: Nov. 16, 2012

(65) Prior Publication Data

US 2014/0042394 A1    Feb. 13, 2014

(30) Foreign Application Priority Data

Aug. 9, 2012  (KR) .................. 10-2012-0087354

(51) Int. Cl.
| | | |
|---|---|---|
| *H01L 51/52* | (2006.01) | |
| *H01L 51/00* | (2006.01) | |
| *H01L 29/786* | (2006.01) | |
| *H01L 27/32* | (2006.01) | |
| *H01L 27/12* | (2006.01) | |

(52) U.S. Cl.
CPC .......... *H01L 51/5203* (2013.01); *H01L 27/124* (2013.01); *H01L 27/3258* (2013.01); *H01L 27/3276* (2013.01); *H01L 29/786* (2013.01); *H01L 51/0014* (2013.01)

(58) Field of Classification Search
CPC ............ H01L 51/0545; H01L 51/0036; H01L 51/0541; H01L 51/5012; B82Y 10/00
See application file for complete search history.

(56) References Cited

U.S. PATENT DOCUMENTS

| | | | |
|---|---|---|---|
| 5,852,481 A | 12/1998 | Hwang | |
| 6,407,780 B1 * | 6/2002 | Sung | 349/43 |
| 7,723,134 B2 | 5/2010 | Jo et al. | |
| 7,833,846 B1 | 11/2010 | Choi et al. | |
| 8,178,879 B2 | 5/2012 | Choi et al. | |
| 2002/0180898 A1 * | 12/2002 | Yoo et al. | 349/43 |
| 2003/0067038 A1 | 4/2003 | Fujikawa | |
| 2005/0134754 A1 | 6/2005 | Yang et al. | |
| 2007/0200981 A1 * | 8/2007 | Souk et al. | 349/106 |
| 2008/0218091 A1 * | 9/2008 | Jo et al. | 315/169.3 |
| 2010/0193790 A1 * | 8/2010 | Yeo et al. | 257/59 |
| 2011/0114954 A1 | 5/2011 | Lee et al. | |
| 2011/0114956 A1 * | 5/2011 | Park et al. | 257/59 |
| 2012/0138921 A1 * | 6/2012 | Endo et al. | 257/43 |
| 2012/0139000 A1 | 6/2012 | Lee et al. | |

FOREIGN PATENT DOCUMENTS

| | | |
|---|---|---|
| KR | 10-2000-0010306 | 2/2000 |
| KR | 10-2005-0081748 | 8/2005 |

* cited by examiner

*Primary Examiner* — Hoai V Pham
*Assistant Examiner* — Long Le
(74) *Attorney, Agent, or Firm* — Robert E. Bushnell, Esq.

(57) ABSTRACT

An organic light-emitting display apparatus basically comprises a thin film transistor, an organic light-emitting device and a pad electrode, and provides an improved adhesive force between a pad portion and an electrode and a stable signal supply. A method of manufacturing the organic light-emitting display apparatus comprises mask processes for forming on a curve layer of a thin film transistor, a pixel electrode and a first pad electrode, a gate electrode and a second pad electrode, contact holes and an interlayer insulating layer, source and drain electrodes and a third pad electrode, and a pixel define layer.

23 Claims, 13 Drawing Sheets

FIG. 2
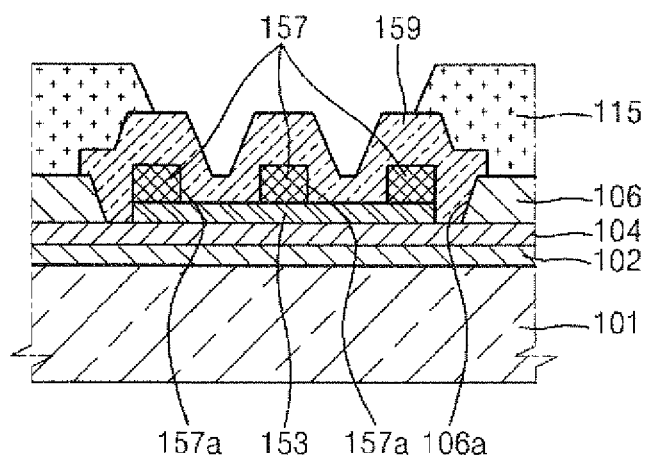
FIG. 3
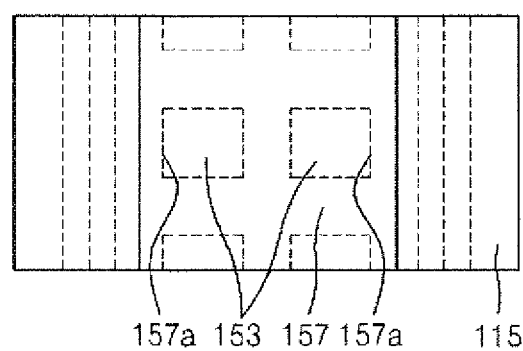

ORGANIC LIGHT-EMITTING DISPLAY APPARATUS AND METHOD OF MANUFACTURING ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 9$^{th}$ of Aug. 2012 and there duly assigned Serial No. 10-2012-0087354.

BACKGROUND OF THE INVENTION

1. Field of the Invention

The present invention relates to an organic light-emitting display apparatus and a method of manufacturing the organic light-emitting display apparatus.

2. Description of the Related Art

Recently, display apparatuses are replaced with portable and thin flat panel display apparatuses. From among panel display apparatuses, organic light-emitting display apparatuses are self-emission type display apparatuses, and are receiving attention as a next-generation display apparatus due to their advantages, such as wide viewing angles, high contrast ratios, and short response speeds.

An organic light-emitting display apparatus includes an intermediate layer, a pixel electrode, and an opposite electrode. The intermediate layer includes an organic emissive layer, and when a voltage is applied to the pixel electrode and the opposite electrode, visible light is generated by an organic emissive layer.

In addition, an organic light-emitting display apparatus includes a driving circuit unit for generating electrical signals and a pad portion for transmitting signals generated by the driving circuit unit.

In this regard, coupling the driving circuit unit with the pad portion is not easy, and thus, coupling characteristics of the driving circuit unit and the pad portion and coupling characteristics of the driving circuit unit and a substrate of the organic light-emitting display apparatus decrease. Accordingly, there is a limit on improving durability of an organic light-emitting display apparatus.

SUMMARY OF THE INVENTION

The present invention relates to an organic light-emitting display apparatus which provides an improved adhesive force between a pad portion and an electrode and a stable signal supply.

According to an aspect of the present invention, there is provided a thin film transistor including an active layer, a gate electrode insulated from the active layer, an interlayer insulating layer covering the gate electrode, and source and drain electrodes which are formed on the interlayer insulating layer and which contact the active layer; an organic light-emitting device including a pixel electrode which is electrically connected to the thin film transistor and which is formed on the same layer as the gate lower electrode, an intermediate layer including an emissive layer, and an opposite electrode, the pixel electrode, the intermediate layer, and the opposite electrode being sequentially stacked; and a pad electrode including a first pad electrode formed on the same layer as the pixel electrode, a second pad electrode formed on the first pad electrode, and a third pad electrode formed on the second pad electrode, the interlayer insulating layer having an opening portion exposing the first pad electrode and the second pad electrode, and the second pad electrode having one or more viaholes that allow the third pad electrode to have a contact with the first pad electrode.

The third pad electrode may contact the second pad electrode, and directly contact the first pad electrode through the viaholes so as to improve an adhesive force among the first pad electrode, the second pad electrode, and the third pad electrode.

The opening portion may completely expose the first pad electrode and the second pad electrode, and may be covered by the third pad electrode.

The opening portion may expose a portion of the second pad electrode, and may be covered by the third pad electrode.

The first pad electrode and the pixel electrode may include the same material.

The pixel electrode and the first pad electrode may include a transparent electrode.

The pixel electrode and the first pad electrode may include ITO.

The second pad electrode and the gate electrode may include the same material.

The gate electrode and the second pad electrode may include at least one material selected from Ag, Mg, Al, Pt, Pd, Au, Ni, Nd, Ir, Cr, Li, Ca, Mo, Ti, W, MoW, and Cu.

The third pad electrode and the source and drain electrodes may include the same material.

The organic light-emitting display apparatus may further include a capacitor that includes a lower capacitor electrode formed on the same layer as the active layer and an upper capacitor electrode formed on the same layer as the gate electrode and that is electrically coupled to the thin film transistor.

An active layer, a gate electrode insulated from the active layer, an interlayer insulating layer covering the gate electrode, and source and drain electrodes that are formed on the interlayer insulating layer and contact the active layer may be included.

According to another aspect of the present invention, there is provided an organic light-emitting display apparatus including: a thin film transistor including an active layer, a gate electrode insulated from the active layer, an interlayer insulating layer covering the gate electrode, and source and drain electrodes which are formed on the interlayer insulating layer and which contact the active layer; an organic light-emitting device including a pixel electrode which is electrically connected to the thin film transistor and which is formed on the same layer as the gate lower electrode, an intermediate layer including an emissive layer, and an opposite electrode, wherein the pixel electrode, the intermediate layer, and the opposite electrode are sequentially stacked; and a pad electrode including a first pad electrode formed on the same layer as the pixel electrode, a second pad electrode formed on the first pad electrode, and a third pad electrode formed on the first pad electrode, the second pad electrode being disposed on the first pad electrode and having one or more trenches exposing a portion of the first pad electrode, the interlayer insulating layer being formed to cover the patterned second pad electrode and having an opening portion exposing a portion of the first pad electrode exposed by the second pad electrode, and the third pad electrode being disposed on the interlayer insulating layer and contacting the exposed first pad electrode.

The third pad electrode may directly contact the first pad electrode through the trenches to improve an adhesive force between the first pad electrode and the third pad electrode.

The opening portion may expose a portion of the first pad electrode, and may be covered by the third pad electrode.

The interlayer insulating layer may be interposed between the third pad electrode and the second pad electrode so that the third pad electrode does not contact the second pad electrode.

The first pad electrode and the pixel electrode may include the same material.

The pixel electrode and the first pad electrode may include a transparent electrode.

The pixel electrode and the first pad electrode may include ITO.

The second pad electrode and the gate electrode may include the same material.

The gate electrode and the second pad electrode may include at least one material selected from Ag, Mg, Al, Pt, Pd, Au, Ni, Nd, Ir, Cr, Li, Ca, Mo, Ti, W, MoW, and Cu.

The third pad electrode and the source and drain electrodes may include a same material.

According to another aspect of the present invention, there is provided a method of manufacturing an organic light-emitting display apparatus, the method including: a first mask process for forming an active layer of a thin film transistor on a substrate; a second mask process for forming a pixel electrode and a first pad electrode; a third mask process for forming a gate electrode on the active layer and a second pad electrode on the first pad electrode; a fourth mask process for forming contact holes exposing both ends of the active layer, an opening exposing a portion of the pixel electrode, and an interlayer insulating layer exposing the first pad electrode and the second pad electrode; a fifth mask process for forming a source electrode and a drain electrode that contact the active layer through the contact holes, and a third pad electrode for covering the first pad electrode and the second pad electrode; and a sixth mask process for forming a pixel define layer exposing at least a portion of the pixel electrode.

The second mask process may include: sequentially forming the gate insulating layer and the first conductive layer on the substrate to cover the active layer; and patterning the conductive layer to form the pixel electrode and the first pad electrode.

The conductive layer may include a transparent metal layer.

The conductive layer may include ITO.

The third mask process includes: forming a second conductive layer to cover the gate insulating layer; and patterning the second conductive layer to form the gate electrode and the second pad electrode.

The second pad electrode may be formed in such a way that one or more viaholes exposing a portion of the first pad electrode are formed in the second conductive layer formed on the first pad electrode.

The fourth mask process may include: forming an interlayer insulating layer to cover the pixel electrode, the gate electrode, the first pad electrode, and the second pad electrode; and patterning the interlayer insulating layer to form the contact holes, the opening exposing a portion of the pixel electrode, and an opening portion exposing the first pad electrode and the second pad electrode.

The fifth mask process may include: forming a third conductive layer on the interlayer insulating layer to cover the contact holes, the opening, and the opening portion; and patterning the third conductive layer to form the source electrode, the drain electrode, and the third pad electrode.

The third pad electrode may contact the first pad electrode through the viaholes.

The sixth mask process may include: forming an insulating layer on the entire surface of the substrate to cover the source electrode and the drain electrode, and the third pad electrode; and patterning the insulating layer to form the pixel define layer, followed by removing the insulating layer to expose the third pad electrode.

The first mask process may further include forming a lower capacitor electrode on the same layer as the active layer on the substrate; and the third mask process may further include forming an upper capacitor electrode on the lower capacitor electrode.

The method may further include, following the sixth mask process, forming an intermediate layer including an emissive layer and an opposite electrode on the pixel electrode upper.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 2 is a cross-sectional view taken along a line II-II of FIG. 1;

FIG. 3 is an enlarged view of portion X of FIG. 1;

DETAILED DESCRIPTION OF THE INVENTION

Expressions such as "at least one of," when preceding a list of elements, modify the entire list of elements but do not modify the individual elements of the list.

Hereinafter, with reference to embodiments illustrated in the attached drawings, the structure and operation of the present invention are described in detail.

Figure 1:
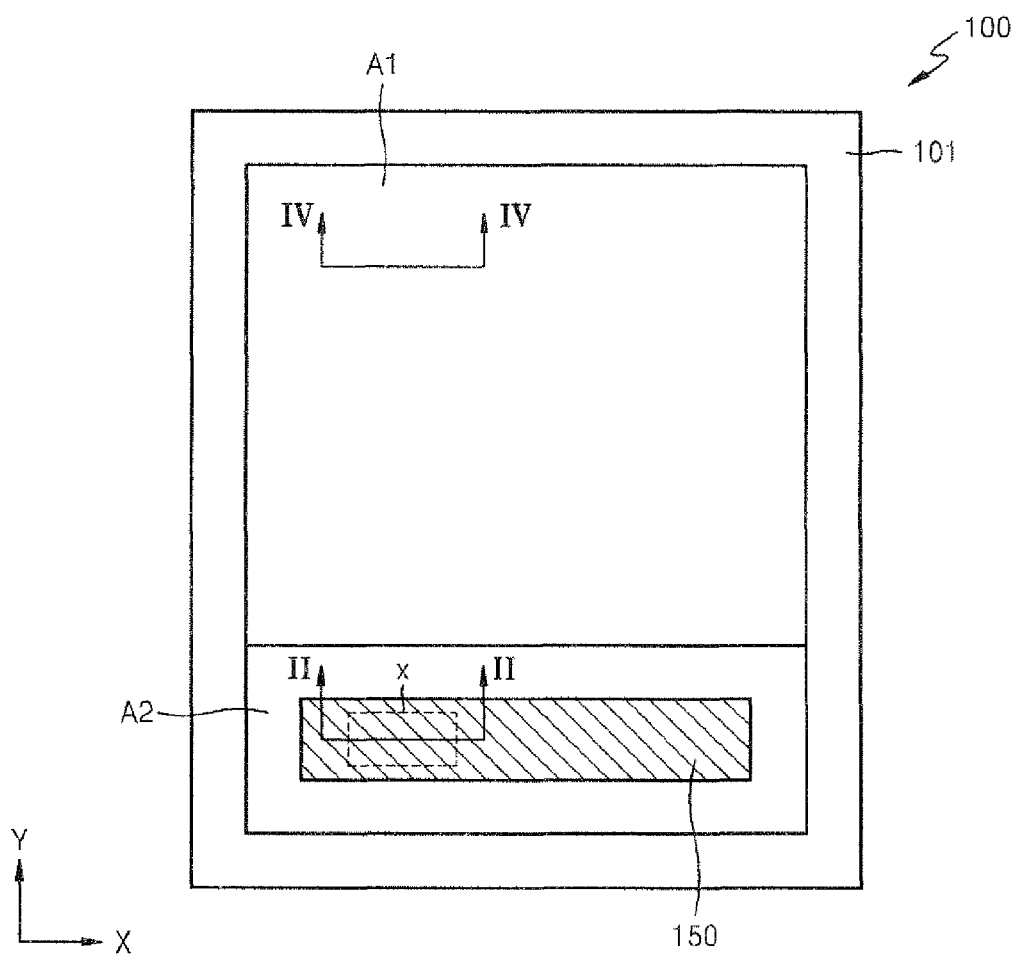
FIG. 1 is a schematic plan view of an organic light-emitting display apparatus according to an embodiment of the present invention.
Figure 4:
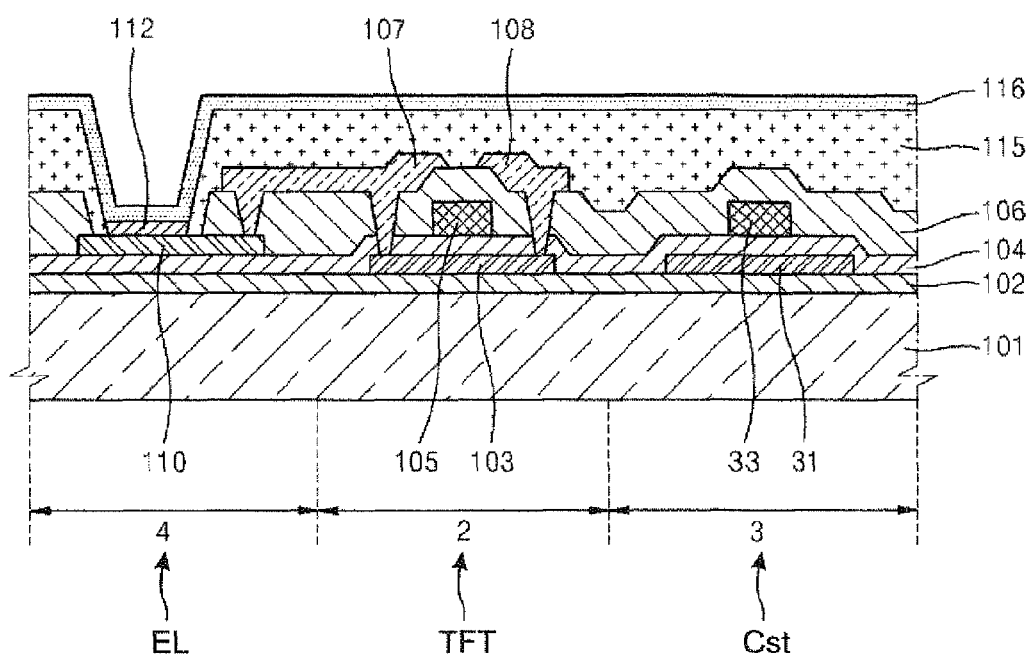
FIG. 4 is a cross-sectional view taken along a line IV-IV of FIG. 1.

FIG. 1 is a schematic plan view of an organic light-emitting display apparatus 100 according to an embodiment of the present invention, FIG. 2 is a cross-sectional view taken along a line II-II of FIG. 1, FIG. 3 is an enlarged view of portion X of FIG. 1, and FIG. 4 is a cross-sectional view taken along a line IV-IV of FIG. 1.

Referring to FIGS. 1 through 4, the organic light-emitting display apparatus 100 includes a substrate 101, a pixel electrode 110, an intermediate layer 112, an opposite electrode 116, pad electrodes 153, 157, and 159, an insulating layer 115, and a driving circuit unit 150.

The substrate 101 may be formed of a transparent glass material that consists of SiO2 as a major component. However, the material for forming the substrate 101 is not limited thereto, and a transparent plastic material may instead be used. A plastic substrate may be formed of an insulating organic material, and may be formed of an organic material selected from the group consisting of polyethersulphone (PES), polyacrylate (PAR), polyetherimide (PEI), polyethylenen napthalate (PEN), polyethyleneterepthalate (PET), polyphenylene sulfide (PPS), polyallylate, polyimide, polycarbonate (PC), cellulose tri acetate (TAC), and cellulose acetate propionate (CAP).

Also, the substrate 101 may be formed of metal or may be in the form of foil.

The substrate 101 may have a display region A1 and a non-display region A2. In FIG. 1, the non-display region A2 is located on a side of the display region A1. However, embodiments of the present invention are not limited thereto. For example, the non-display region A2 may be located on facing sides of the display region A1, or may surround the display region A1.

The display region A1 includes a plurality of sub pixels (not shown) for generating visible light to allow a user to recognize a display image. In addition, each of the sub pixels includes a pixel electrode 110, an intermediate layer 112, and an opposite electrode 116. A related structure thereof is illustrated in FIG. 4, and is described later.

The non-display region A2 includes a plurality of pad electrodes 153, 157, and 159. The pad electrodes 153, 157, and 159 may transmit electrical signals or power to the display region A1. For example, electrical signals generated by the driving circuit unit 150 are transmitted to the display region A1 through the pad electrodes 153, 157, and 159.

The pad electrodes 153, 157, and 159 are electrically connected to the driving circuit unit 150 via an anisotropic conductive film (not shown). The anisotropic conductive film may include an insulating film (not shown) and a conductive ball (not shown).

The pad electrodes 153, 157, and 159 may include a first pad electrode 153, a second pad electrode 157, and a third pad electrode 159.

The first pad electrode 153 is formed on a gate insulating layer 104. The first pad electrode 153 and the pixel electrode 110 are formed of the same material. When the organic light-emitting display apparatus 100 is a bottom emission type apparatus, the first pad electrode 153 may, like the pixel electrode 110, be formed of a transparent material, such as ITO.

The first pad electrode 153 and the pixel electrode 110 are formed by performing the same process. That is, when a metal layer is formed on the gate insulating layer 104 and then patterned to form the pixel electrode 110, the first pad electrode 153 may be formed by performing the same mask process.

The second pad electrode 157 is formed on the first pad electrode 153. The second pad electrode 157 includes one or more viaholes 157a. The viaholes 157a of the second pad electrode 157 may be formed to expose the first pad electrode 153. Through the viaholes 157a, the third pad electrode 159 contacts the first pad electrode 153. A related description thereof is presented below.

The second pad electrode 157 may be formed of the same material as used in forming the gate electrode 105. The second pad electrode 157 and the gate electrode 105 may be formed of at least one material selected from the group consisting of Ag, Mg, Al, Pt, Pd, Au, Ni, Nd, Ir, Cr, Li, Ca, Mo, Ti, W, MoW, and Cu.

The second pad electrode 157 and the gate electrode 105 may be formed by performing the same process. For example, when a metal layer formed of at least one material selected from Ag, Mg, Al, Pt, Pd, Au, Ni, Nd, Ir, Cr, Li, Ca, Mo, Ti, W, MoW, and Cu is formed, and then, the metal layer is patterned to form the gate electrode 105, the second pad electrode 157 is formed by the patterning.

The first pad electrode 153 and the second pad electrode 157 may be exposed by an opening 106a of the interlayer insulating layer 106.

The third pad electrode 159 may be formed on the second pad electrode 157. The third pad electrode 159 covers the second pad electrode 157, and in particular, may be formed inside the viaholes 157a of the second pad electrode 157, thereby contacting the first pad electrode 153 via the viaholes 157a.

The third pad electrode 159 may be formed of the same material as used in forming the source electrode 108 and the drain electrode 107. The third pad electrode 159, the source electrode 108, and the drain electrode 107 may be formed of metal, such as Au, Pd, Pt, Ni, Rh, Ru, Ir, Os, Al, Mo, Nd, Mo, W, or Ti, or an alloy including such metal.

The third pad electrode 159 may be formed by performing the same process as used to form the source electrode 108 and the drain electrode 107. That is, a metal layer formed of metal, such as Au, Pd, Pt, Ni, Rh, Ru, Ir, Os, Al, Mo, Nd, Mo, W, or Ti, or an alloy containing such metal is formed, and then, the metal layer is patterned to form the source electrode 108, the drain electrode 107, and the third pad electrode 159.

A portion of the third pad electrode 159 may be exposed by a pixel define film 115. The portion of the third pad electrode 159 exposed by the pixel define film 115 may be electrically connected to an anisotropic conductive film (not shown).

As described above, since the third pad electrode 159 may contact, in addition to the second pad electrode 157, the first pad electrode 153 through the viaholes 157a, an adhesive force between the pad electrodes 153, 157, and 159 may be improved. In addition, since the first pad electrode 153 is formed under the second pad electrode 157, even when the second pad electrode 157 is damaged, a stable signal supply may be achieved through the first pad electrode 153.

The display region A1 is described below in detail with reference to FIG. 4. The substrate 101 may be divided into a transistor region 2, a storage region 3, and a light-emission region 4.

An auxiliary layer 102 may be formed on the substrate 101. The auxiliary layer 102 may provide a flat surface above the substrate 101, and may prevent permeation of water and foreign materials toward the substrate 101.

The transistor region 2 includes a thin film transistor TFT as a driving device. The TFT may include an active layer 103, the gate electrode 105, and the source and drain electrodes 108 and 107.

The active layer 103 may be formed on the auxiliary layer 102. The active layer 103 may be formed of an inorganic semiconductor, such as amorphous silicon or poly silicon, or an organic semiconductor, and may include a source region, a drain region, and a channel region. The source and drain regions may be formed by doping the active layer 103 formed of amorphous silicon or poly silicon with impurities. When the doping is performed with boron (B), which is an element of Group 3, a p-type semiconductor may be formed, and when the doping is performed with nitrogen (N), which is an element of Group 5, an n-type semiconductor may be formed.

The gate insulating layer 104 may be formed on the active layer 103, and the gate electrode 105 is formed on a portion of the insulating layer 104. The gate insulating layer 104 may be formed of an organic material, or an inorganic material, such as SiNx or SiO2, to insulate the active layer 103 from the gate electrode 105.

The gate electrode 105 may be a single-layer or multi-layer formed of at least one material selected from Ag, Mg, Al, Pt, Pd, Au, Ni, Nd, Ir, Cr, Li, Ca, Mo, Ti, W, MoW, and Cu, but it is not limited thereto. The gate electrode 105 is insulated from the active layer 103 by the first insulating layer 104 as a gate insulating film interposed therebetween. In addition, the active layer 103 has source and drain regions (not shown) doped with high-concentration impurities on both ends thereof, and the source and drain regions are connected to the source and drain electrodes 108 and 107, respectively.

The storage region 3 includes a capacitor Cst. The capacitor Cst includes a lower capacitor electrode 31 and an upper capacitor electrode 33, and the first insulating layer 104 is interposed between the lower capacitor electrode 31 and the upper capacitor electrode 33. In this regard, the lower capacitor electrode 31 and the active layer 103 of the TFT may be formed on the same layer. The lower capacitor electrode 31 may be formed of a semiconductor material, and may be doped with impurities to improve electrical conductivities. Also, the upper capacitor electrode 33 may be formed on the same layer as the gate electrode 105 of the TFT and the pixel electrode 110 of an organic light-emitting device (EL).

The light-emission region 4 includes the organic light-emitting device (EL). The organic light-emitting device (EL) may include the pixel electrode 110 connected to one of the source and drain electrodes 108 and 107, respectively, of the TFT, the opposite electrode 116 facing the pixel electrode 110, and the intermediate layer 112 interposed between the pixel electrode 110 and the opposite electrode 116. The pixel electrode 110 may be formed of a transparent conductive material, and the pixel electrode 110 and the first pad electrode 153 may be formed of the same material on the same layer.

Figure 5:
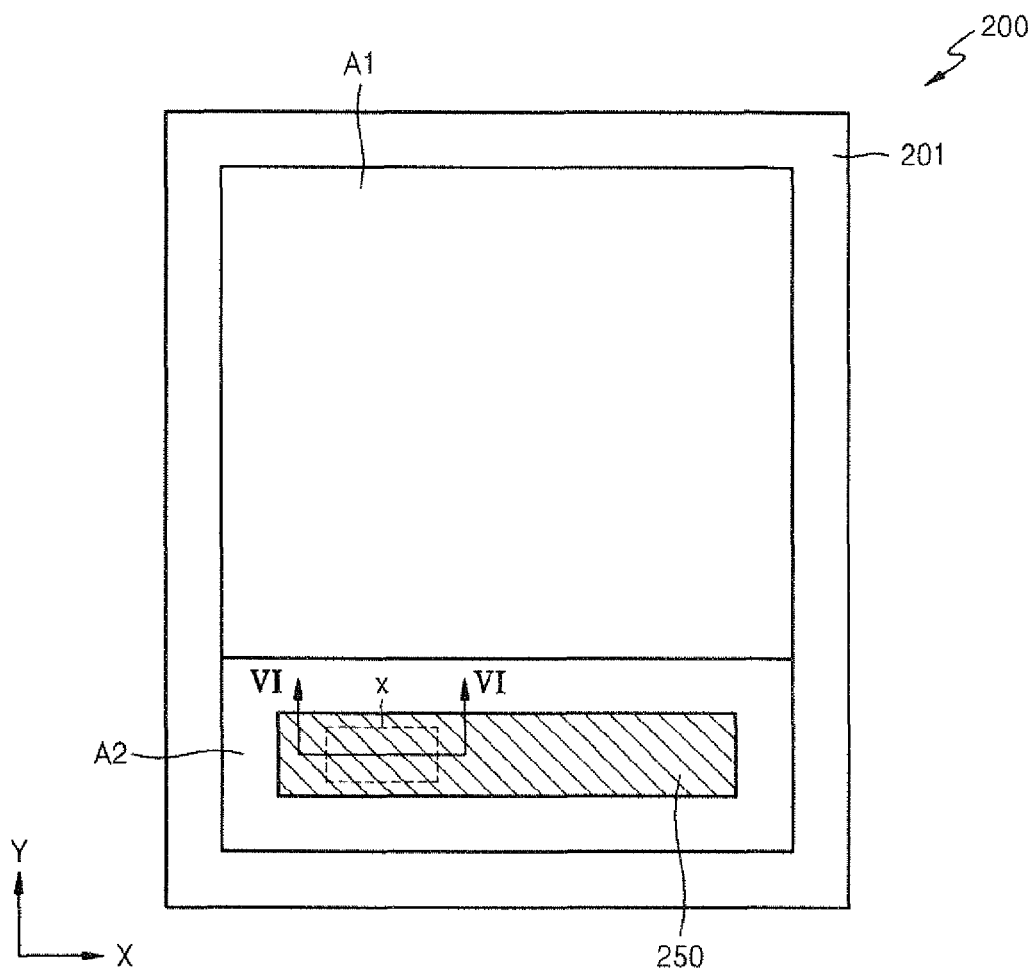
FIG. 5 is a schematic plan view of an organic light-emitting display apparatus according to another embodiment of the present invention.
Figure 6:
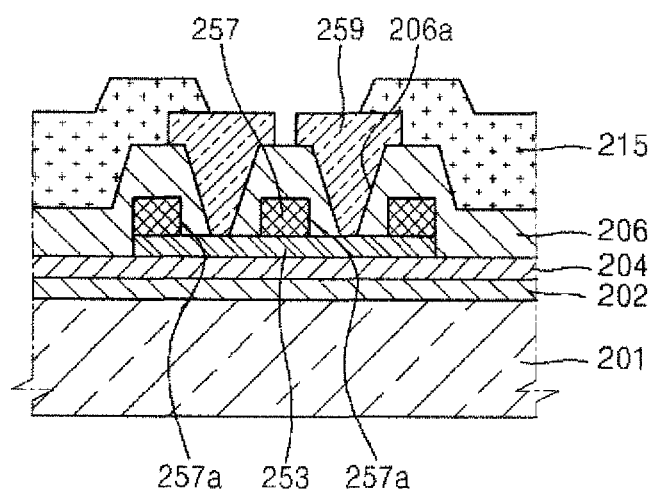
FIG. 6 is a cross-sectional view taken along a line VI-VI of FIG. 5.
Figure 7:
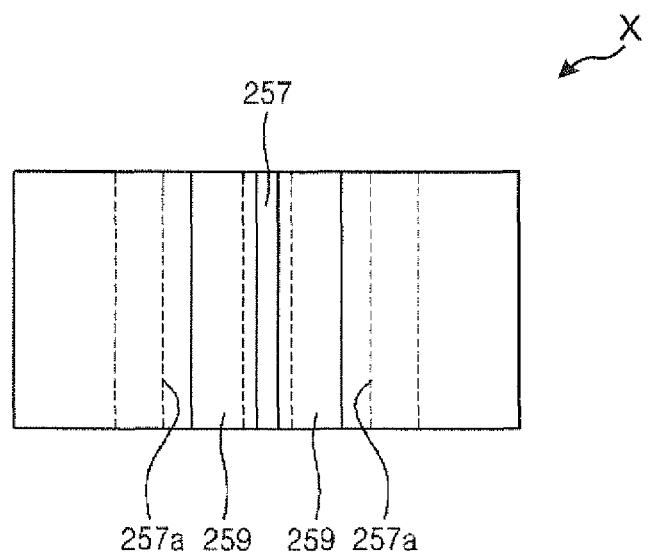
FIG. 7 is an enlarged view of portion X of FIG. 5.

FIG. 5 is a schematic plan view of an organic light-emitting display apparatus 200 according to another embodiment of the present invention, FIG. 6 is a cross-sectional view taken along a line VI-VI of FIG. 5, and FIG. 7 is an enlarged view of portion X of FIG. 5.

Referring to FIGS. 5 through 7, the organic light-emitting display apparatus 200 includes a substrate 201, a pixel electrode (not shown), an intermediate layer (not shown), an opposite electrode (not shown), pad electrodes 253, 257, and 259, an insulating layer 215, a driving circuit unit 250, and an anisotropic conductive film (not shown). Hereinafter, the organic light-emitting display apparatus 200 according to the present embodiment is described in detail based on a difference between the organic light-emitting display apparatus 200 and the organic light-emitting display apparatus 100 according to the previous embodiment.

The substrate 201 may have a display region A1 and a non-display region A2. In FIG. 5, the non-display region A2 is located on a side of the display region A1. However, embodiments of the present invention are not limited thereto. For example, the non-display region A2 may be located on facing sides of the display region A1, or may surround the display region A1.

The display region A1 includes a plurality of sub pixels (not shown) for generating visible light to allow a user to recognize a display image. In addition, each of the sub pixels includes a pixel electrode (not shown), an intermediate layer (not shown), and an opposite electrode (not shown). A related description thereof will be omitted herein since it is already described with reference to FIG. 4.

The non-display region A2 includes a plurality of pad electrodes 253, 257, and 259. The pad electrodes 253, 257, and 259 may transmit electrical signals or power to the display region A1. For example, electrical signals generated by the driving circuit unit 250 are transmitted to the display region A1 through the pad electrodes 253, 257, and 259.

The pad electrodes 253, 257, and 259 are electrically connected to the driving circuit unit 250 via an anisotropic conductive film (not shown). The anisotropic conductive film may include an insulating film (not shown) and a conductive ball (not shown).

The pad electrodes 253, 257, and 259 may include a first pad electrode 253, a second pad electrode 257, and a third pad electrode 259.

The first pad electrode 253 is formed on a gate insulating layer 204. The first pad electrode 253 and the pixel electrode (not shown) are formed of the same material. When the organic light-emitting display apparatus 200 is a bottom emission type apparatus, the first pad electrode 253 may, like the pixel electrode (not shown), be formed of a transparent material, such as ITO.

The first pad electrode 253 and the pixel electrode are formed by performing the same process. That is, when a metal layer is formed on the gate insulating layer 204 and then patterned to form the pixel electrode, the first pad electrode 253 may be formed by using the same mask used in patterning the pixel electrode.

The second pad electrode 257 is formed on the first pad electrode 253. The second pad electrode 257 includes one or more trenches 257a. The trenches 257a of the second pad electrode 257 may be formed to expose the first pad electrode 253. Through the trenches 257a, the third pad electrode 259 contacts the first pad electrode 253. A related description thereof is presented below.

The second pad electrode 257 may be formed of the same material as used in forming an upper gate electrode (not shown). The second pad electrode 257 and the upper gate electrode may be formed of at least one material selected from the group consisting of Ag, Mg, Al, Pt, Pd, Au, Ni, Nd, Ir, Cr, Li, Ca, Mo, Ti, W, MoW, and Cu.

The second pad electrode 257 and the upper gate electrode may be formed by performing the same process. For example, when a metal layer formed of at least one material selected from Ag, Mg, Al, Pt, Pd, Au, Ni, Nd, Ir, Cr, Li, Ca, Mo, Ti, W, MoW, and Cu is formed, and then, the metal layer is patterned to form the upper gate electrode, the second pad electrode 257 is formed by the patterning.

The second pad electrode 257 is covered by an interlayer insulating layer 206, and the first pad electrode 253 is exposed by an opening portion 206a of the interlayer insulating layer 206. The opening portion 206a of the interlayer insulating layer 206 is formed along the trenches 257a of the second pad electrode 257, and a portion of the first pad electrode 253 is exposed by the opening portion 206a.

The third pad electrode 259 is formed on the interlayer insulating layer 206, and may contact the first pad electrode 253 via the opening portion 206a of the interlayer insulating layer 206. The interlayer insulating layer 206 is interposed between the third pad electrode 259 and the second pad electrode 257.

The third pad electrode 259 may be formed of a material that is used in forming a source electrode and a drain electrode. The third pad electrode 259, the source electrode, and the drain electrode may be formed of metal, such as Au, Pd, Pt, Ni, Rh, Ru, Ir, Os, Al, Mo, Nd, Mo, W, or Ti, or an alloy including such metal.

The third pad electrode 259 may be formed by performing the same process as used to form the source electrode and the drain electrode. That is, a metal layer formed of metal, such as Au, Pd, Pt, Ni, Rh, Ru, Ir, Os, Al, Mo, Nd, Mo, W, or Ti, or an alloy containing such metal is formed, and then, the metal layer is patterned to form the source electrode, the drain electrode, and the third pad electrode 259.

A portion of the third pad electrode 259 may be exposed by a pixel define film 215. The portion of the third pad electrode 259 exposed by the pixel define film 215 may be electrically connected to an anisotropic conductive film (not shown).

As described above, since the third pad electrode 259 may contact the first pad electrode 253 through the opening portion 206a, an adhesive force between the first pad electrode 253 and the third pad electrode 259 may be improved. In addition, since the first pad electrode 253 is formed under the second pad electrode 257, even when the second pad electrode 257 is damaged, a stable signal supply may be achieved through the first pad electrode 253.

Figure 8:
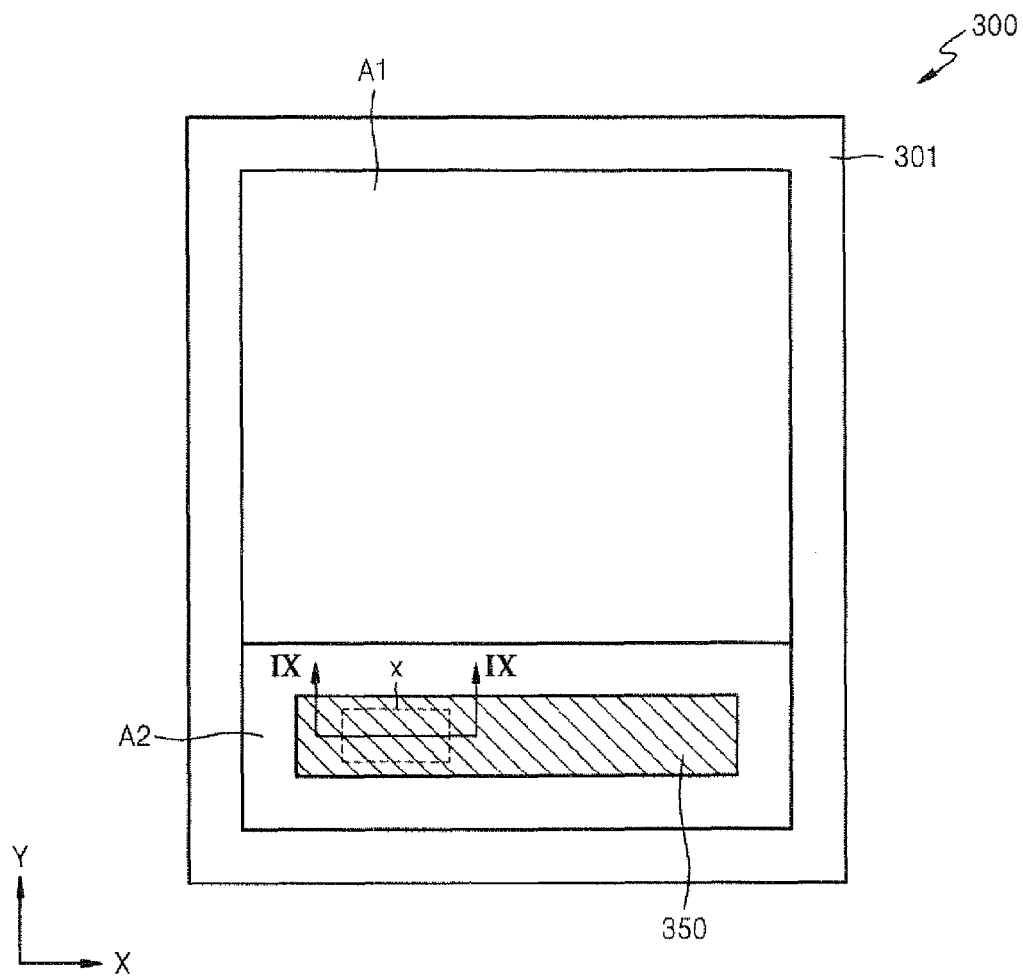
FIG. 8 is a schematic plan view of an organic light-emitting display apparatus according to another embodiment of the present invention.
Figure 9:
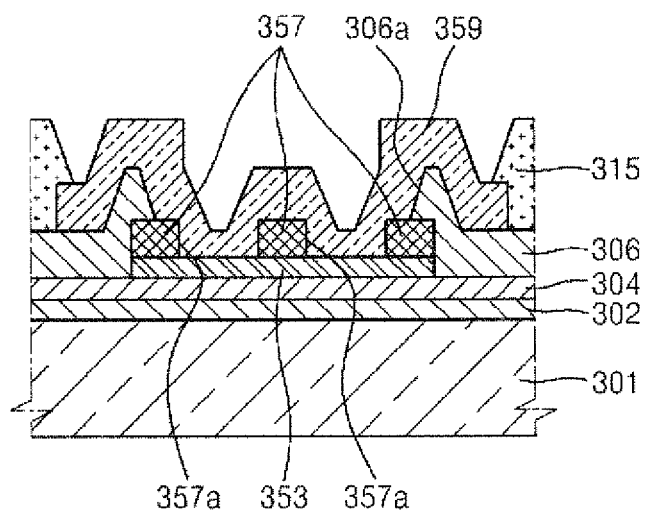
FIG. 9 is a cross-sectional view taken along a line IX-IX of FIG. 8.
Figure 10:
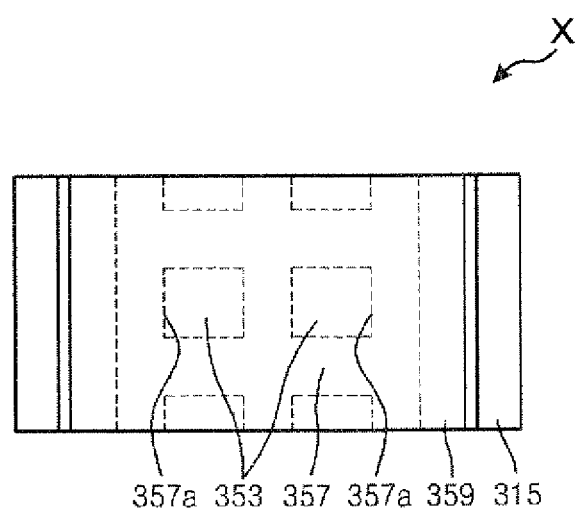
FIG. 10 is an enlarged view of portion X of FIG. 8.

FIG. 8 is a schematic plan view of an organic light-emitting display apparatus 300 according to another embodiment of the present invention, FIG. 9 is a cross-sectional view taken along a line IX-IX of FIG. 8, and FIG. 10 is an enlarged view of portion X of FIG. 8.

Referring to FIGS. 8 through 10, the organic light-emitting display apparatus 300 includes a substrate 301, a pixel electrode (not shown), an intermediate layer (not shown), a facing electrode (not shown), pad electrodes 353, 357, and 359, a pixel define layer 315, and a driving circuit unit 350.

The substrate 301 may have a display region A1 and a non-display region A2. In FIG. 8, the non-display region A2 is located on a side of the display region A1. However, embodiments of the present invention are not limited thereto. For example, the non-display region A2 may be located on facing sides of the display region A1, or may surround the display region A1.

The display region A1 includes a plurality of sub pixels (not shown) for generating visible light to allow a user to recognize a display image. In addition, each of the sub pixels includes a pixel electrode (not shown), an intermediate layer (not shown), and an opposite electrode (not shown). A related description thereof is already described above.

The non-display region A2 includes a plurality of pad electrodes 353, 357, and 359. The pad electrodes 353, 357, and 359 may transmit electrical signals or power to the display region A1. For example, electrical signals generated by the driving circuit unit 350 are transmitted to the display region A1 through the pad electrodes 353, 357, and 359.

The pad electrodes 353, 357, and 359 are electrically connected to the driving circuit unit 350 via an anisotropic conductive film (not shown). The anisotropic conductive film may include an insulating film (not shown) and a conductive ball (not shown).

The pad electrodes 353, 357, and 359 may include a first pad electrode 353, a second pad electrode 357, and a third pad electrode 359.

The first pad electrode 353 is formed on a gate insulating layer 304. The first pad electrode 353 and the pixel electrode (not shown) are formed of the same material. When the organic light-emitting display apparatus 300 is a bottom emission type apparatus, the first pad electrode 353 may, like the pixel electrode, be formed of a transparent material, such as ITO.

The first pad electrode 353 and the pixel electrode are formed by performing the same process. That is, when a metal layer is formed on the gate insulating layer 304 and then patterned to form the pixel electrode, the first pad electrode 353 may be formed by using the same mask used in patterning the pixel electrode.

The second pad electrode 357 is formed on the first pad electrode 353. The second pad electrode 357 includes one or more viaholes 357a. The viaholes 357a of the second pad electrode 357 may be formed to expose the first pad electrode 353. Through the viaholes 357a, the third pad electrode 359 contacts the first pad electrode 353. A related description thereof is presented below.

The second pad electrode 357 may be formed of the same material as used in forming an upper gate electrode (not shown). The second pad electrode 357 and the upper gate electrode may be formed of at least one material selected from the group consisting of Ag, Mg, Al, Pt, Pd, Au, Ni, Nd, Ir, Cr, Li, Ca, Mo, Ti, W, MoW, and Cu.

The second pad electrode 357 and the upper gate electrode may be formed by performing the same process. For example, when a metal layer formed of at least one material selected from Ag, Mg, Al, Pt, Pd, Au, Ni, Nd, Ir, Cr, Li, Ca, Mo, Ti, W, MoW, and Cu is formed, and then, patterned to form the upper gate electrode, the second pad electrode 357 is formed by the patterning.

A portion of the second pad electrode 357 is exposed by the opening 306a of the interlayer insulating layer 306. Since the interlayer insulating layer 306 covers a portion of the second pad electrode 357, the interlayer insulating layer 306 may prevent permeation of an etching solution or water from a side surface of the organic light-emitting display apparatus 300, thereby preventing damage of the second pad electrode 357.

The third pad electrode 359 may be formed on the second pad electrode 357. The third pad electrode 359 covers the second pad electrode 357, and in particular, may be formed inside the viaholes 357a of the second pad electrode 357, thereby contacting the first pad electrode 353 via the viaholes 357a.

The third pad electrode 359 may be formed of a material that is used in forming a source electrode (not shown) and a drain electrode (not shown). The third pad electrode 359, the source electrode, and the drain electrode may be formed of metal, such as Au, Pd, Pt, Ni, Rh, Ru, Ir, Os, Al, Mo, Nd, Mo, W, or Ti, or an alloy including such metal.

The third pad electrode 359 may be formed by performing the same process as used to form the source electrode and the drain electrode. That is, a metal layer formed of metal, such as Au, Pd, Pt, Ni, Rh, Ru, Ir, Os, Al, Mo, Nd, Mo, W, or Ti, or an alloy containing such metal is formed, and then, the metal layer is patterned to form the source electrode, the drain electrode, and the third pad electrode 359.

A portion of the third pad electrode 359 may be exposed by a pixel define film 315. The portion of the third pad electrode 359 exposed by the pixel define film 315 may be electrically connected to an anisotropic conductive film (not shown).

As described above, since the third pad electrode 359 may contact, in addition to the second pad electrode 357, the first pad electrode 353 through the viaholes 357a, an adhesive force between the pad electrodes 353, 357, and 359 may be improved. In addition, since the first pad electrode 353 is formed under the second pad electrode 357, even when the second pad electrode 357 is damaged, a stable signal supply through the first pad electrode 353 may be achieved.

Figure 19:
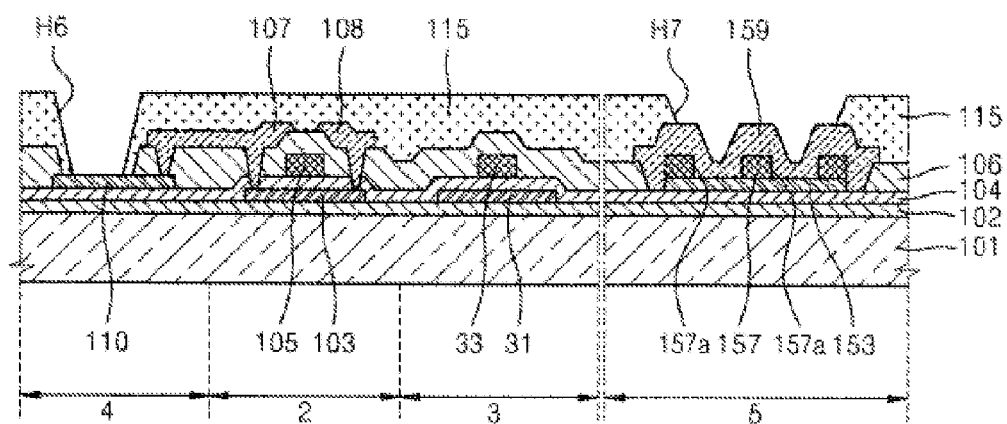
Figure 20:
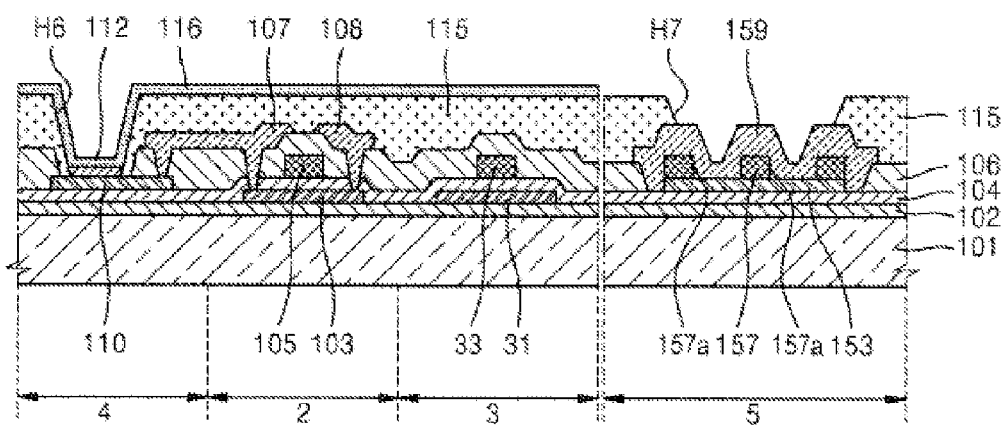
Figure 21:
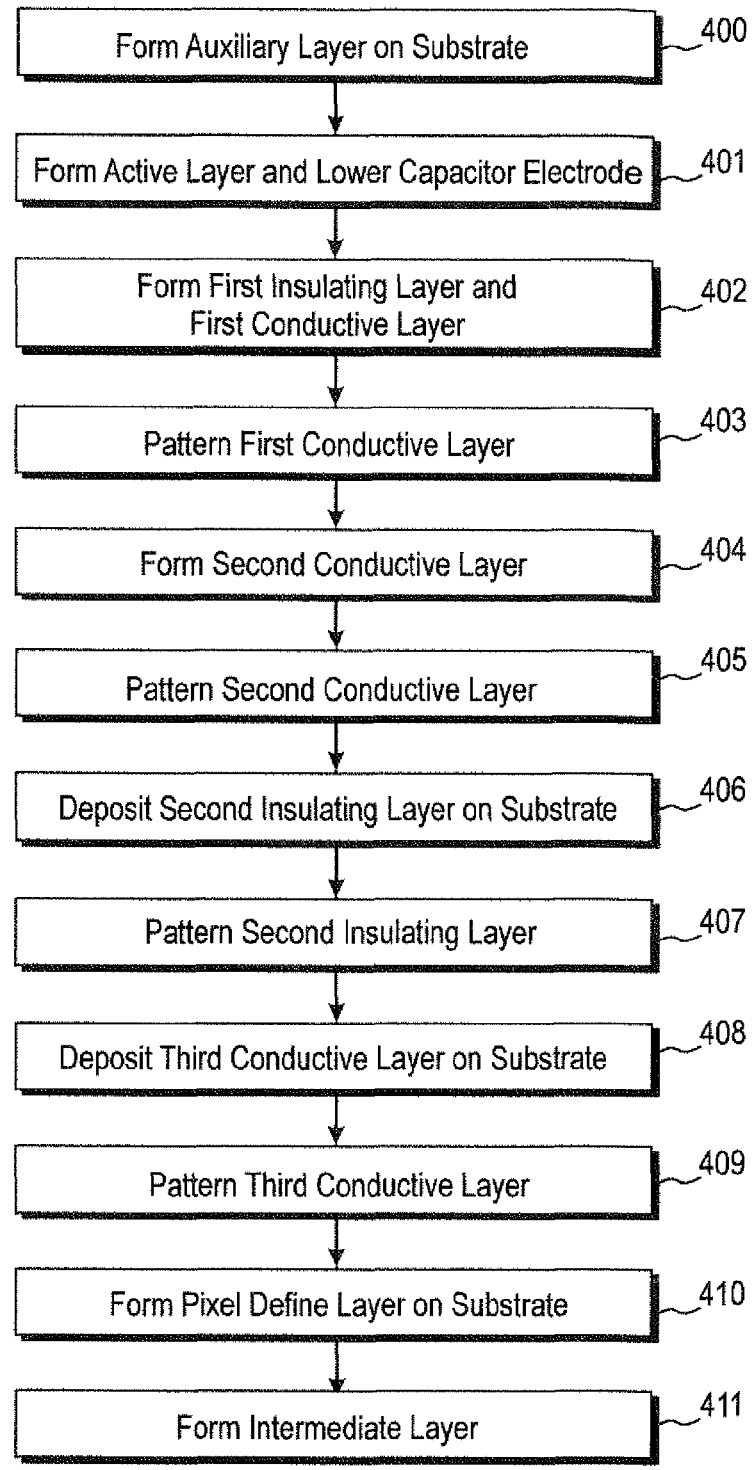
FIG. 21 is a flowchart of the method of manufacturing the organic light-emitting display apparatus according to FIGS. 11 through 20.

FIGS. 11 through 20 are cross-sectional views schematically illustrating a method of manufacturing an organic light-emitting display apparatus according to an embodiment of the present invention, and FIG. 21 is a flowchart of the method of manufacturing the organic light-emitting display apparatus according to FIGS. 11 through 20. Hereinafter, a method of manufacturing the organic light-emitting display apparatus 100 is schematically described.

Figure 11:
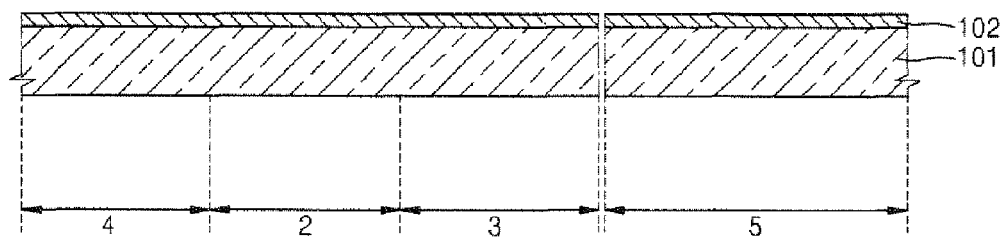
FIGS. 11 through 20 are cross-sectional views schematically illustrating a method of manufacturing an organic light-emitting display apparatus according to an embodiment of the present invention.

First, as illustrated in FIG. 11, the auxiliary layer 102 is formed on the substrate 101 (FIG. 21, block 400). In detail, the substrate 101 may be formed of a transparent glass material that mainly consists of $SiO_2$. However, the material for forming the substrate 101 is not limited thereto and, for example, it may be a transparent material or a metal material.

In addition, the auxiliary layer 102, such as a barrier layer, a blocking layer, and/or a buffer layer, may be formed on the substrate 101 to prevent diffusion of impurity ions and permeation of water molecules or external air to planarize a surface. The auxiliary layer 102 may be formed by using $SiO_2$ and/or SiNx. In this case, various deposition methods, such as plasma enhanced chemical vapor deposition (PECVD), atmospheric pressure CVD (APCVD), or low pressure CVD (LPCVD), may be used.

Figure 12:
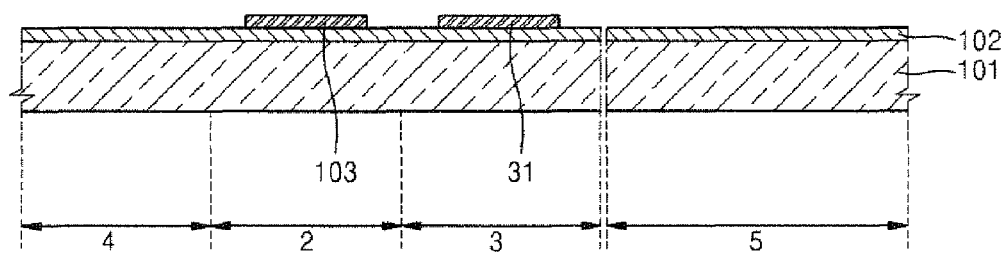

Then, as illustrated in FIG. 12, the active layer 103 of the TFT and the lower capacitor electrode 31 are formed on the auxiliary layer 102 (FIG. 21, block 401). In detail, an amorphous silicon layer (not shown) is deposited on the auxiliary layer 102, and is then crystallized to form a polycrystalline silicon layer (not shown). The amorphous silicon may be crystallized by using various methods, such as rapid thermal annealing (RTA), solid phase crystallization (SPC), excimer laser annealing (ELA), metal induced crystallization (MIC), metal induced lateral crystallization (MILC), or sequential lateral solidification (SLS). In addition, the polycrystalline silicon layer may be patterned to form the active layer 103 of the TFT and the lower capacitor electrode 31 by performing a mask process using a first mask (not shown). The pixel electrode 110 and the first pad electrode 153 are patterned by performing a mask process using a first mask (not shown).

In the present embodiment, the active layer 103 is separated from the lower capacitor electrode 31. However, the active layer 103 and the lower capacitor electrode 31 may be integrally formed.

Figure 13:
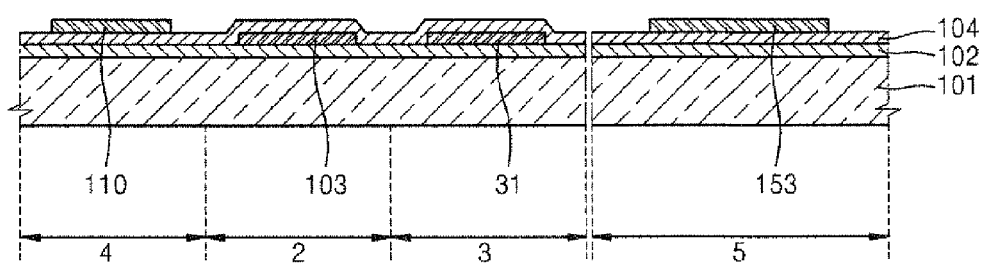

Next, as illustrated in FIG. 13, the first insulating layer 104 and a first conductive layer (not shown) are sequentially formed on the entire surface of the substrate 101 on which the active layer 103 and the lower capacitor electrode 31 are formed (FIG. 21, block 402), and then, the first conductive layer is patterned to form the pixel electrode 110 and the first pad electrode 153 (FIG. 21, block 403).

The first insulating layer 104 may be formed by depositing an inorganic insulating film formed of, for example, SiNx or SiOx by using PECVD, APCVD, or LPCVD. The first insulating layer 104 is interposed between the active layer 103 and the gate electrode (see 105 of FIG. 14) of the TFT so as to function as a gate insulating layer of the TFT, and is interposed between the upper capacitor electrode (see 33 of FIG. 14) and the lower capacitor electrode 31 so as to function as a dielectric layer of a capacitor Cst.

The first conductive layer (not shown) may include at least one material selected from ITO, IZO, ZnO, and $In_2O_3$. Later, the first conductive layer (not shown) may be patterned to form the pixel electrode 110 and the first pad electrode 153. The pixel electrode 110 and the first pad electrode 153 may be patterned by performing a mask process using a second mask (not shown).

Figure 14:
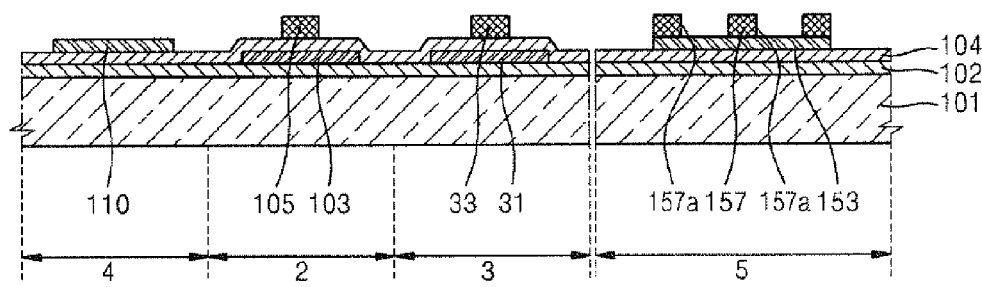

Then, as illustrated in FIG. 14, a second conductive layer (not shown) is formed to cover the first insulating layer 104 (FIG. 21, block 404), and then, the second conductive layer is patterned to form the gate electrode 105, the upper capacitor electrode 33, and the second pad electrode 157 (FIG. 21, block 405).

The second conductive layer (not shown) may include at least one material selected from Ag, Mg, Al, Pt, Pd, Au, Ni, Nd, Ir, Cr, Li, Ca, Mo, Ti, W, MoW, and Cu. According to another embodiment of the present invention, the second conductive layer (not shown) may be formed so as to have a three-layered structure of Mo—Al—Mo. Later, the second conductive layer (not shown) may be patterned to form the gate electrode 105 and the second pad electrode 157.

However, the first and second conductive layers are not limited thereto, and they may be any one of various layers as long as the first conductive layer (not shown) includes a material that has better anti-corrosive properties than that of the second conductive layer (not shown), and the second conductive layer (not shown) includes a material that has smaller resistance than the first conductive layer (not shown) so as to allow the current to flow well.

The gate electrode 105, the upper capacitor electrode 33, and the second pad electrode 157 may be formed by patterning the second conductive layer by using a third mask (not shown).

In this regard, in the transistor region 2, the gate electrode 105 may be formed on the active layer 103.

In this regard, the gate electrode 105 is formed so as to correspond to a center of the active layer 103, and by using the gate electrode 105 as a self align mask, the active layer 103 is doped with n-type or p-type impurities to form source and drain regions (not shown) on facing ends of the active layer 103 corresponding to both sides of the gate electrode 105, and a channel region (not shown) between the source and drain regions. In this regard, impurities may be a boron (B) ion or phosphorus (P) ion.

In the storage region 3, the upper capacitor electrode 33 may be formed on the lower capacitor electrode 31. Also, in the pad region 5, the second pad electrode 157 for forming a pad electrode may be formed.

The second pad electrode 157 may have the viaholes 157a. The viaholes 157a may vertically pass through the second pad electrode 157, and the third pad electrode (see 159 of FIG. 18), which is to be formed later, may contact the first pad electrode 153 via the viaholes 157a.

Figure 15:
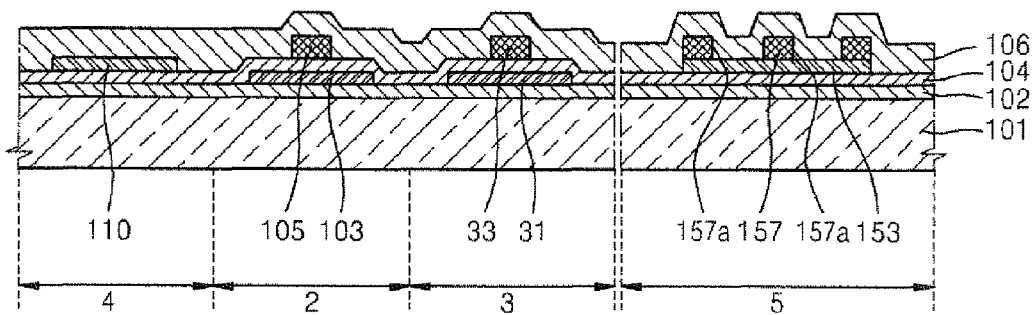

Then, as illustrated in FIG. 15, the second insulating layer 106 is deposited on the entire surface of the substrate 101 on which the gate electrode 105 is formed.

The second insulating layer 106 may be formed by spin coating at least one organic insulating material selected from the group consisting of polyimide, polyamide, an acryl resin, benzocyclobutene, and a phenol resin. The second insulating layer 106 may have a sufficient thickness and, for example, it may be thicker than the first insulating layer 104 so as to function as an interlayer insulating layer between the gate electrode 105 and the source and drain electrodes 108 and 107, respectively, of the TFT (see FIG. 18). In addition, the second insulating layer 106 may be formed of, instead of such organic insulating materials, inorganic insulating materials that are used to form the first insulating layer 104. According to an embodiment of the present invention, an organic insulating material and an inorganic insulating material may be alternately stacked to form the second insulating layer 106.

Figure 16:
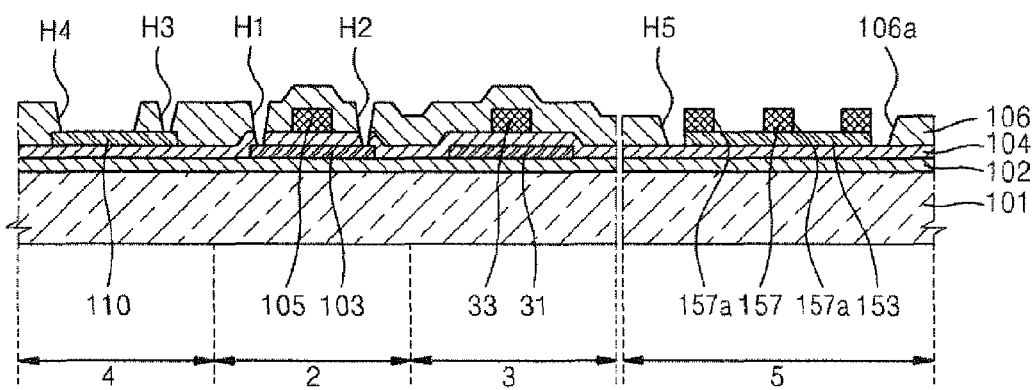

Then, as illustrated in FIG. 16, the second insulating layer 106 is patterned to form openings H3 and H4 exposing the pixel electrode 110, contact holes H1 and H2 exposing portions of source and drain regions of the active layer 103, and an opening portion H5 exposing the first and second pad electrodes 153 and 157, respectively (FIG. 21, block 407).

In detail, the second insulating layer 106 is patterned to form contact holes H1 and H2, openings H3 and H4, and an opening portion H5 by performing a mask process using a fourth mask (not shown). Herein, the contact holes H1 and H2 expose portions of the source and drain regions, and the opening H3 and the opening H4 expose portions of the pixel electrode 110. The opening portion H5 exposes upper and side surfaces of the first and second pad electrodes 153 and 157, respectively.

In addition, as illustrated in FIG. 16, the opening portion H5 may completely expose the first and second pad electrodes 153 and 157, respectively, but is not limited thereto. As illustrated in FIG. 9, the opening portion H5 may expose a portion of the second pad electrode (357 of FIG. 9).

Figure 17:
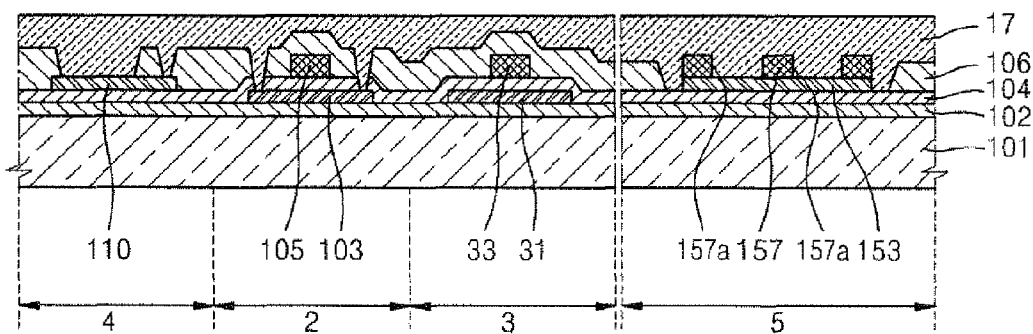

Then, as illustrated in FIG. 17, a third conductive layer 17 is deposited on the entire surface of the substrate 101 so as to cover the interlayer insulating layer 106 (FIG. 21, block 408).

The third conductive layer 17 may be formed of the same conductive materials as used to form the first or second conductive layers (not shown), but the material for forming the third conductive layer 17 is not limited thereto, and various other conductive materials may instead be used in forming the third conductive layer 17. In addition, such conductive materials may be deposited to a thickness that is sufficient to fill the contact holes H1 and H2, the openings H3 and H4, and the opening portion H5.

Figure 18:
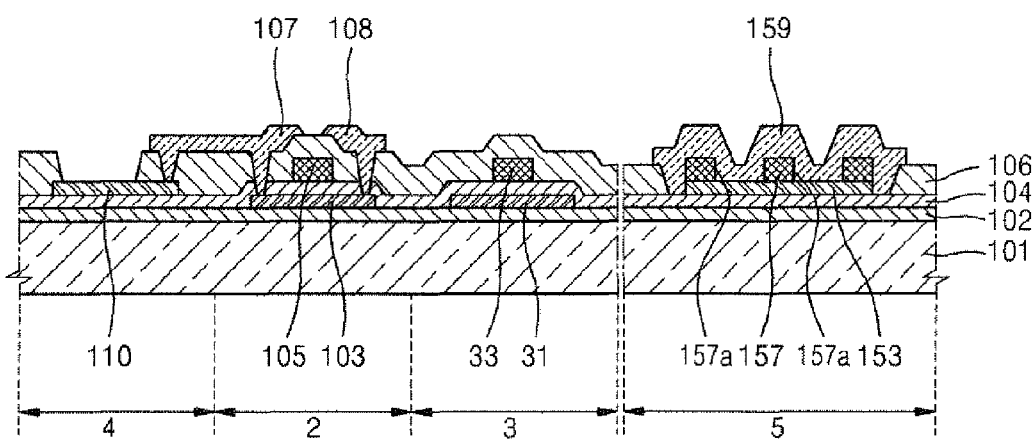

Next, as illustrated in FIG. 18, the third conductive layer (see 17 of FIG. 17) is patterned to form the source and drain electrodes 108 and 107, respectively, and third pad electrode 159 (FIG. 21, block 409).

In detail, the third conductive layer (see 17 of FIG. 17) is patterned by performing a mask process using a fifth mask (not shown) to form the source and drain electrodes 108 and 107, respectively, and the third pad electrode 159.

Herein, one of the source and drain electrodes 108 and 107, respectively, for example, the drain electrode 107, in the case of the present embodiment, is formed to have a connection with the pixel electrode 110 through the opening H3 exposing an edge of the pixel electrode 110.

In addition, the forming of the source and drain electrodes 108 and 107, respectively, may be simultaneously performed with the forming of the third pad electrode 159. However, the present invention is not limited thereto. For example, the source and drain electrodes 108 and 107, respectively, are formed, and then, the third pad electrode 159 may be formed by additionally performing an etching process.

The third pad electrode 159 covers the first and second pad electrodes 153 and 157, respectively, and contacts the first pad electrode 153 through the viaholes 157a. In addition, the third pad electrode 159 may completely cover the opening portion H5.

Then, as illustrated in FIG. 19, the pixel define layer (PDL) 115 is formed on the substrate 101 (FIG. 21, block 410).

In detail, a third insulating layer (not shown) is deposited on the entire surface of the substrate 101 on which the pixel electrode 110, the source and drain electrodes 108 and 107, respectively, and the third pad electrode 159 are deposited. In this regard, the third insulating layer may be formed by, for example, spin-coating at least one organic insulating material selected from polyimide, polyamide, acryl resin, benzocyclerobutene, and a phenol resin. In addition, the third insulating layer may be formed of, instead of such organic insulating materials, an inorganic insulating material selected from $SiO_2$, $SiNx$, $Al_2O_3$, $CuOx$, $Tb_4O_7$, $Y_2O_3$, $Nb_2O_5$, and $Pr_2O_3$. In addition, the third insulating layer may have a multi-layered structure in which an organic insulating material and an inorganic insulating material are alternately stacked.

Meanwhile, the third insulating layer may be deposited on the pad region 5, or may not be deposited.

The third insulating layer is patterned by performing a mask process using a sixth mask (not shown) to form an opening H6 exposing a central portion of the pixel electrode 110, thereby defining a pixel. When the third insulating layer is deposited on the pad region 5, the opening H7 is formed in the third insulating layer on the pad region 5 by performing a mask process using the sixth mask, and the third pad electrode 159 is exposed by the opening H7. As described above, the third insulating layer having the openings H6 and H7 is the pixel define film 115.

Then, as illustrated in FIG. 20, the intermediate layer 112 including an emissive layer EML, and the opposite electrode 116, are formed in the opening H6 exposing the pixel electrode 110 (FIG. 21, block 411).

The intermediate layer 112 may include an emissive layer EML, and at least one functional layer FL selected from a hole transport layer (HTL), a hole injection layer (HIL), an electron transport layer (ETL), and an electron injection layer (EIL), and these layers may each have a single-layered or multi-layered structure.

The organic emissive layer may include a small molecular organic material or a polymer organic material.

When an organic emissive layer is formed of a small molecular organic material, the intermediate layer 112 may include an HTL and an HIL sequentially stacked in a direction from an organic EML to the pixel electrode 110, and an ETL and an EIL sequentially stacked in a direction from the organic EML to the opposite electrode 116. In addition, various other layers may be deposited. An available organic material used herein may be copper phthalocyanine (CuPc), N,N'-di(naphthalene-1-yl)-N,N'-diphenyl-benzidine (NPB), or tris-8-hydroxyquinoline aluminum (Alq3).

Meanwhile, when the organic EML is formed of a polymer organic material, the intermediate layer 112 may include only an HTL in the direction from the organic EML to the pixel electrode 110. The HTL may be formed on the pixel electrode 110 by inkjet-printing or spin-coating poly-(2,4)-ethylene-dihydroxy thiophene (PEDOT) or polyaniline (PANI). In this regard, an available organic material may be a poly-phenylenevinylene (PPV)-based polymer organic material and a polyfluorene-based polymer organic material, and such materials are used to form a color pattern by ink jet printing, spin coating, or a thermal transfer printing using a laser.

The opposite electrode 116 may be formed on the entire surface of the substrate 101 so as to function as a common electrode. Regarding the organic light-emitting display apparatus 100, the pixel electrode 110 is used as an anode and the opposite electrode 116 is used as a cathode. In some embodiments, the pixel electrode 110 is used as a cathode, and the opposite electrode 116 is used as an anode.

When the organic light-emitting display apparatus 100 is a bottom emission type display apparatus in which an image is embodied toward the substrate 101, the pixel electrode 110 is a transparent electrode and the opposite electrode 116 is a reflective electrode. In this regard, the reflective electrode may be formed by depositing metal having a small work function, for example, Ag, Mg, Al, Pt, Pd, Au, Ni, Nd, Ir, Cr, Li, Ca, LiF/Ca, LiF/Al, or a compound thereof, to a small thickness.

According to an embodiment of the present invention, the organic light-emitting display apparatus provides an improved adhesive force between a pad portion and an electrode, and a stable signal supply.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a thin film transistor;
    a pixel electrode connected to the thin film transistor;
    an emissive layer disposed on the pixel electrode;
    an opposite electrode disposed on the emissive layer; and
    a pad electrode including a first pad electrode disposed on a same layer as the pixel electrode, a second pad electrode disposed on the first pad electrode, and a third pad electrode disposed on the second pad electrode, the first pad electrode comprising a same material as the pixel electrode.

2. The organic light-emitting display apparatus of claim 1, further comprised of the third pad electrode contacting the second pad electrode, the second pad electrode having at least one viahole that allows the third pad electrode to have contact with the first pad electrode, and the third pad electrode directly contacting the first pad electrode through the at least one viahole so as to improve an adhesive force among the first pad electrode, the second pad electrode, and the third pad electrode.

3. The organic light-emitting display apparatus of claim 1, the thin film transistor including a gate electrode, an interlayer insulating layer covering the gate electrode, the interlayer insulating layer having an opening portion exposing the first pad electrode and the second pad electrode, the opening portion leaving no portion of the first pad electrode or the second pad electrode in contact with the interlayer insulating layer, and the opening portion being covered by the third pad electrode.

4. The organic light-emitting display apparatus of claim 1, the thin film transistor including a gate electrode, an interlayer insulating layer covering the gate electrode, the interlayer insulating layer having an opening portion exposing the first pad electrode and the second pad electrode, the opening portion exposing a portion of the second pad electrode, and the opening portion being covered by the third pad electrode.

5. The organic light-emitting display apparatus of claim 1, further comprised of the pixel electrode and the first pad electrode comprising a transparent electrode.

6. The organic light-emitting display apparatus of claim 5, further comprised of the pixel electrode and the first pad electrode comprising ITO.

7. The organic light-emitting display apparatus of claim 1, the thin film transistor including a gate electrode, the second pad electrode and the gate electrode comprising a same material.

8. The organic light-emitting display apparatus of claim 7, further comprised of the gate electrode and the second pad electrode comprising at least one material selected from Ag, Mg, Al, Pt, Pd, Au, Ni, Nd, Ir, Cr, Li, Ca, Mo, Ti, W, MoW, and Cu.

9. The organic light-emitting display apparatus of claim 1, the thin film transistor including source and drain electrodes, the third pad electrode and the source and drain electrodes comprising the same material.

10. The organic light-emitting display apparatus of claim 1, the thin film transistor including an active layer and a gate electrode, the apparatus further comprising a capacitor that includes a lower capacitor electrode formed on a same layer as the active layer and an upper capacitor electrode formed on a same layer as the gate electrode, the capacitor being electrically coupled to the thin film transistor.

11. The organic light-emitting display apparatus of claim 1, the thin film transistor including a gate electrode, an interlayer insulating layer covering the gate electrode, the interlayer insulating layer having an opening portion exposing the first pad electrode and the second pad electrode, the second pad electrode having at least one viahole that allows the third pad electrode to have contact with the first pad electrode, and the first pad electrode not having any opening overlapping said at least one viahole of the second pad electrode.

12. The organic light-emitting display apparatus of claim 1, the entire bottom surface of the pixel electrode being on a same layer as the first pad electrode.

13. An organic light-emitting display apparatus, comprising:
    a thin film transistor;
    a pixel electrode connected to the thin film transistor;
    an emissive layer disposed on the pixel electrode;
    an opposite electrode disposed on the emissive layer; and
    a pad electrode including a first pad electrode disposed on a same layer as the pixel electrode, a second pad electrode disposed on the first pad electrode, and a third pad electrode disposed on the first pad electrode, the first pad electrode comprising a same material as the pixel electrode.

14. The organic light-emitting display apparatus of claim 13, the second pad electrode having at least one trench exposing a portion of the first pad electrode, the third pad electrode directly contacting the first pad electrode through said at least one trench so as to improve an adhesive force between the first pad electrode and the third pad electrode.

15. The organic light-emitting display apparatus of claim 13, the thin film transistor including a gate electrode, the apparatus further comprised of an interlayer insulating layer covering the gate electrode and the second pad electrode and having an opening portion, the opening portion exposing a portion of the first pad electrode, and being covered by the third pad electrode.

16. The organic light-emitting display apparatus of claim 13, the thin film transistor including a gate electrode, the apparatus further comprised of an interlayer insulating layer covering the gate electrode and being interposed between the third pad electrode and the second pad electrode so that the third pad electrode does not contact the second pad electrode.

17. The organic light-emitting display apparatus of claim 13, further comprised of the pixel electrode and the first pad electrode comprising a transparent electrode.

18. The organic light-emitting display apparatus of claim 17, further comprised of the pixel electrode and the first pad electrode comprising ITO.

19. The organic light-emitting display apparatus of claim 13, the thin film transistor including a gate electrode, the second pad electrode and the gate electrode comprising a same material.

20. The organic light-emitting display apparatus of claim 19, further comprised of the gate electrode and the second pad electrode comprising at least one material selected from Ag, Mg, Al, Pt, Pd, Au, Ni, Nd, Ir, Cr, Li, Ca, Mo, Ti, W, MoW, and Cu.

21. The organic light-emitting display apparatus of claim 13, the thin film transistor including a gate electrode, an interlayer insulating layer covering the gate electrode, and source and drain electrodes that are formed on the interlayer insulating layer, the third pad electrode and the source and drain electrodes comprising a same material.

22. The organic light-emitting display apparatus of claim 13, the thin film transistor including a gate electrode, an interlayer insulating layer covering the gate electrode, the second pad electrode being disposed on the first pad electrode and having at least one trench exposing a portion of the first pad electrode, the interlayer insulating layer being formed to cover the second pad electrode and having an opening portion exposing a portion of the first pad electrode exposed by the second pad electrode, the third pad electrode being disposed on the interlayer insulating layer and contacting the exposed first pad electrode, and the first pad electrode not having any opening overlapping said at least one trench of the second pad electrode.

23. The organic light-emitting display apparatus of claim 13, the entire bottom surface of the pixel electrode being on a same layer as the first pad electrode.

* * * * *